US006857841B2

(12) United States Patent
Lering

(10) Patent No.: US 6,857,841 B2
(45) Date of Patent: Feb. 22, 2005

(54) VEHICLE FOR TRANSPORTING A SEMICONDUCTOR DEVICE CARRIER TO A SEMICONDUCTOR PROCESSING TOOL

(75) Inventor: Michael Lering, Bubenreuth (DE)

(73) Assignee: Infineon Technologies SC300 GmbH & Co. KG, Dresden (DE)

( * ) Notice: Subject to any disclaimer, the term of this patent is extended or adjusted under 35 U.S.C. 154(b) by 0 days.

(21) Appl. No.: 10/401,193

(22) Filed: Mar. 27, 2003

(65) Prior Publication Data

US 2003/0180134 A1 Sep. 25, 2003

Related U.S. Application Data

(63) Continuation of application No. PCT/EP01/11182, filed on Sep. 26, 2001.

(30) Foreign Application Priority Data

Sep. 27, 2000 (EP) .............................................. 00121040

(51) Int. Cl.$^7$ .............................................. B65G 49/07
(52) U.S. Cl. ........................ 414/539; 414/396; 414/940
(58) Field of Search ................................. 414/495, 539, 414/940, 396, 663

(56) References Cited

U.S. PATENT DOCUMENTS 5,154,730 A    10/1992  Hodos et al.
5,655,869 A  *  8/1997  Scheler et al. .......... 414/222.01
5,975,825 A  * 11/1999  Blattner et al. .............. 414/217
6,019,563 A  *  2/2000  Murata et al. .......... 414/222.01
6,102,647 A  *  8/2000  Yap .............................. 414/539
6,205,881 B1 *  3/2001  Gravell et al. ............. 74/483 R
6,364,593 B1 *  4/2002  Hofmeister et al. ...... 414/217.1
6,454,512 B1 *  9/2002  Weiss .......................... 414/663
6,468,017 B1 * 10/2002  Haris .......................... 414/401
6,592,318 B2 *  7/2003  Aggarwal ................. 414/217.1

FOREIGN PATENT DOCUMENTS

WO    99/39386    8/1999
WO    00/55074    9/2000

OTHER PUBLICATIONS

Drew, M. et al.: "Flexible ToolL Interfaces Increase REesponsiveness of Process Equipment Suppliers", Automation, Solid State Technology, Jul. 1996, pp. 217, 218, 220, 222, 225, 227, 228.

* cited by examiner

Primary Examiner—James W. Keenan
(74) Attorney, Agent, or Firm—Laurence A. Greenberg; Werner H. Stemer; Gregory L. Mayback

(57) ABSTRACT

A vehicle for transporting semiconductor devices is used for servicing loadports of semiconductor processing tools with device carriers by use of a portal hoist. Thereby, the vehicle contains an empty inner space and an open front side, such that the loadport is enclosed by the vehicle, when it approaches and docks to the loadport. Time for loading is shortened, complexity of structure and procedure is reduced and cleanroom space is saved.

6 Claims, 2 Drawing Sheets

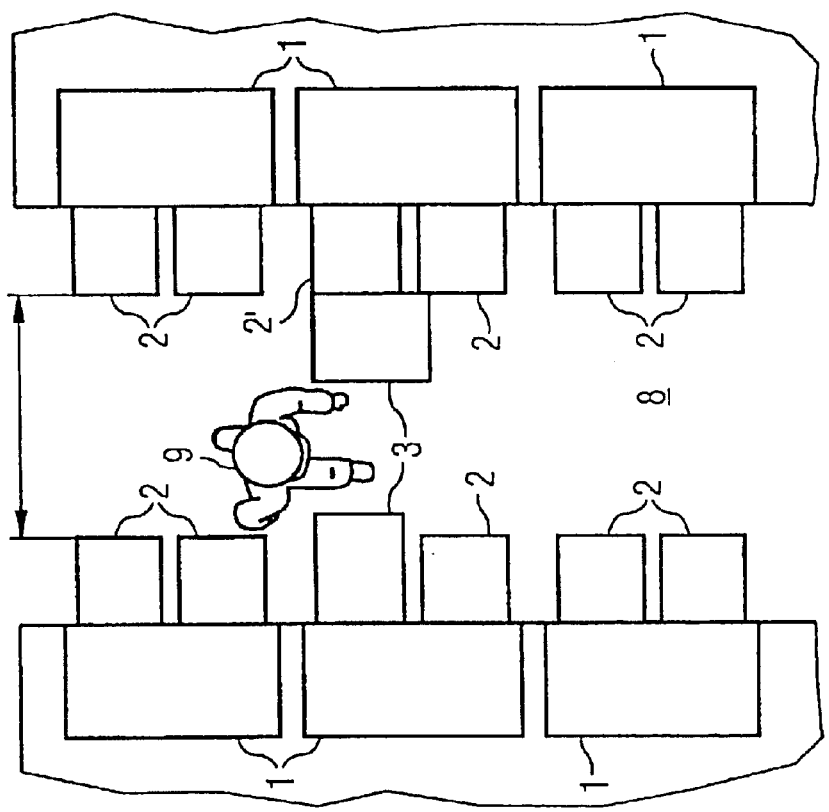
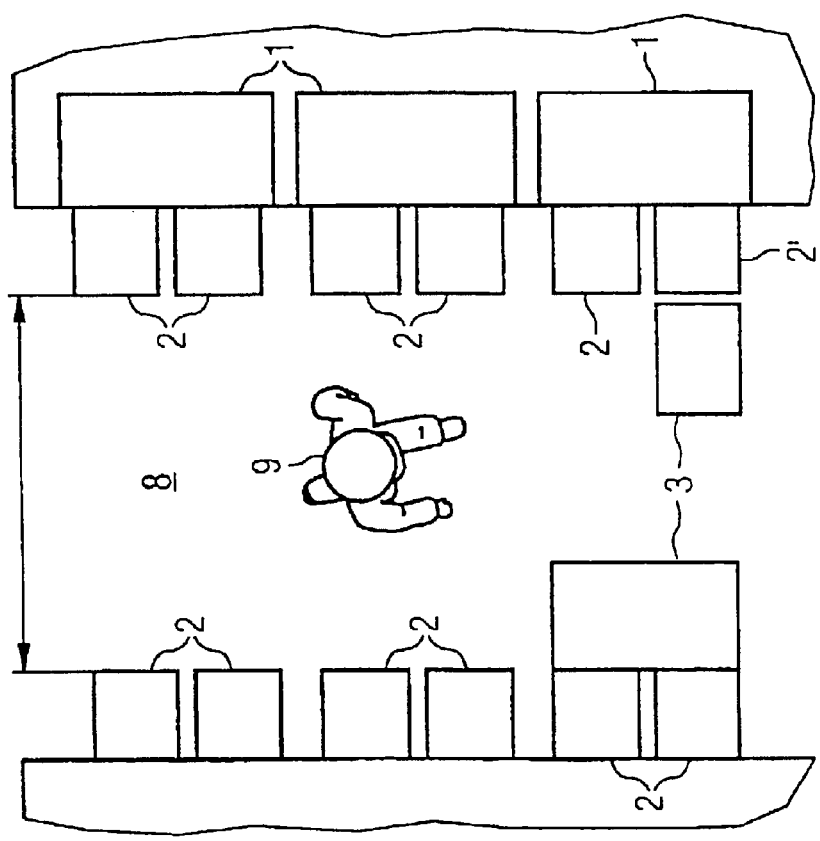

VEHICLE FOR TRANSPORTING A SEMICONDUCTOR DEVICE CARRIER TO A SEMICONDUCTOR PROCESSING TOOL

CROSS-REFERENCE TO RELATED APPLICATION

This application is a continuation of copending International Application No. PCT/EP01/11182, filed Sep. 26, 2001 which designated the United States.

BACKGROUND OF THE INVENTION

FIELD OF THE INVENTION

The present invention relates to a vehicle for transporting a semiconductor device carrier to a semiconductor processing tool.

In semiconductor device fabrication a commonly used transport device for semiconductor carriers containing semiconductor devices such as wafers is the so-called person guided vehicle (PGV). For Example, in the clean room area of wafer fabs, these vehicles are pushed manually by operators to transfer one or more wafer carriers from one processing tool to the next according to the wafer processing sequence.

The structure and form of person guided vehicles may vary considerably from fab to fab or even from bay to bay depending on the local requirements which have to be fulfilled, such as the type of the loadports of the processing tool, the number and size of the water carrier to be transferred or the dimensions of the aisles and processing tools with loadports in the clean room area. With the advent of larger wafer sizes having diameters of 200 mm or 300 mm, filled wafer carriers have become too heavy to be handled manually. Instead, a mechanical transfer device on top of the vehicles perform the task of placing or picking up the wafer carrier to and from the loadports of the processing tools, which are then operated manually.

Commonly used transfer devices contain lift booms. In a corresponding loading step for instance, the vehicle is first required to dock to the processing tool having the destination loadport in order to achieve high placement precision.

In the docking position the vehicle stands in front of the loadport with the device carrier located on top of the vehicle in front of the loadport. Then, the wafer carrier is taken and either turned or pushed to the loadport by the lift boom. For this purpose the vehicle requires a structure such as to outweigh the eccentric weight of the wafer carrier, when the lift boom is expanded, resulting in a larger total weight or size.

The footprint of equipment and the aisles in the clean room area are strong contributors to non-value added costs of wafer production. Therefore, the large sizes and the circumstantial position in front of the loadports requiring broad aisles increase wafer fabrication costs. A minimum width between two limiting sides of an aisle added by the size of two vehicles serving two opposite processing tools is necessary, in order to guarantee operators free paths to emergency exits, even if the aisles are crowded with vehicles.

Moreover, manual transfer or transfer with the lift boom of the wafer carrier onto the loadport requires the time of the operating staff and may cause particle contamination due to vibration. Since vehicles have to deal with a variety of differently configured loadports, they usually lack a unique transfer handling, and are therefore not adapted to specific loadport configurations such as the upcoming norm-compliant loadports.

SUMMARY OF THE INVENTION

It is accordingly an object of the invention to provide a vehicle for transporting a semiconductor device carrier to a semiconductor processing tool which overcomes the above-mentioned disadvantages of the prior art devices of this general type, which has a smaller footprint thereby saving costs.

With the foregoing and other objects in view there is provided, in accordance with the invention, a vehicle for transporting a semiconductor device carrier to a semiconductor processing tool. The semiconductor processing tool has a loadport for the semiconductor device carrier attached to the semiconductor processing tool. The loadport has a side length, a side depth, and a height. The semiconductor processing tool provides a free space above a top surface of the loadport. The loadport is configured for receiving the semiconductor device carrier on the top surface of the loadport and the semiconductor device carrier has an interface for assisting in lifting the semiconductor device carrier. The vehicle contains a U-shaped chassis as viewed from a bottom perspective. The U-shaped chassis contains a skeleton of support elements surrounding and defining an inner space. The inner space is free of any of the support elements of the skeleton, and the U-shaped chasis has an open front side configured for receiving the loadport into the inner space. The inner space has a length larger than the side length of the loadport, and the inner space has a depth greater than the side depth of the loadport. A set of wheels is mounted to the U-shaped chassis for moving the vehicle. A lifting device is mounted to the U-shaped chassis within a vertical height range of a free space designated for the loadport. The lifting device is provided for placing or picking up the semiconductor device carrier onto the loadport when the loadport is received within the inner space. Vertically disposable lift connector devices are mounted to the lifting device for connecting to the interface for assisting in lifting the device carrier. A crank mechanism is mounted on the U-shaped chassis for operating the lifting device.

According to the present invention, a vehicle is provided, that significantly reduces the area of the footprint needed to load or unload the loadport of the processing tool in case the loadport is docked to the processing tool in such a style, that the loadport structure can be enclosed by the vehicle during the loading step. For this purpose the vehicle has an inner space, that is free of any vehicle support structures, and an open front side, that allows any protrusion of the processing tool, i.e. the loadport and related supports beneath it, or service wheels, a free passage to that inner space, when the vehicle is approaching and docking to the processing tool.

Thus, instead of taking a docking and loading position in front of the load port, the load port is overlapped by the vehicle. The vehicle therefore has a location closer to the processing tool leaving more space in the aisles between the processing tools within the base.

The common regulations concerning the emergency exits requiring minimum widths of aisles inside the cleanroom area admit a denser layout of the processing tools inside the bay due to smaller aisles, if the requirements of the loadports according to the invention are followed within the bay and if only the vehicles according to the present invention are used. Thus, a considerable amount of costs can be saved due to the decreased footprint of the vehicles and aisles in the expensive cleanroom area.

A further advantage arises from the construction of loading the loadport with the device carrier from the top. A lifting device is mounted on the chassis of the vehicle carrying the device carrier, with the height of the bottom surface of the device carrier being in a higher position than the loadport surface. Although the opposite case, where the device carrier has a level below the loadport surface, is not ruled out, the aforementioned position is to be preferred, because no additional lifting is needed when docking to the loadport.

In the docking position the device carrier held by the lifting device is located in a free space above the loadport surface, while the loadport is enclosed by the vehicle located in the inner space of the vehicle. In order to load the loadport, the device carrier just has to be lifted down by the lifting device onto the loadport surface. Therefore, no horizontal motion is necessary and a high precision placement is easily implemented. Moreover, since there is no eccentric movement of the device carrier, the center of gravity of the vehicle when projected down to the floor is not significantly changed, thus simplifying the structure of supports of the vehicle reducing its weight and size.

The lifting device is operated by a crank mechanism mounted on the chassis of the vehicle for lifting the device carrier in a vertical direction. Since according to the invention there is only one axis of movement, the forces and vibration acting on the devices in the device carrier are advantageously reduced. The small amount of lifting path additionally saves time to load or unload the device carrier.

A further aspect considers a device for docking to a load port. Having installed such a device, the vehicle will be in a fixed position enclosing the loadport, and the device carrier will be in a position directly above the loadport. An automatic precision placement of the device carrier onto the load port is therefore straightforwardly implemented.

Other features which are considered as characteristic for the invention are set forth in the appended claims.

Although the invention is illustrated and described herein as embodied in a vehicle for transporting a semiconductor device carrier to a semiconductor processing tool, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2A is diagrammatic, top plan view demonstrating a determination of a minimum width of aisles between processing tools within a base according to prior art; and FIG. 2B is a diagrammatic, top plan view illustrating a determination of the minimum width of the aisles between the processing tools within the base according to the invention.

DESCRIPTION OF THE PREFERRED EMBODIMENTS

Figure 1A:
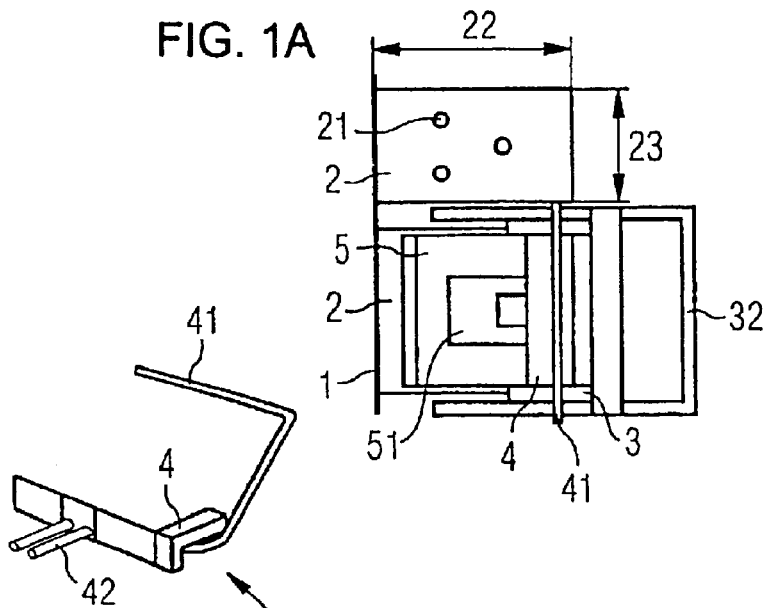
FIG. 1A is a diagrammatic, top plan view of a preferred embodiment of a vehicle according to the invention.

Referring now to the figures of the drawing in detail and first, particularly, to FIGS. 1A–1E thereof, there is shown an embodiment according to the invention in which a person guided vehicle is provided, that is suited to so-called balcony type loadports 2. Ideally, such a loadport 2 protrudes orthogonally out of a front side of a processing tool 1. Preferably, the loadport 2 is compliant with SEMI-norm E15.1. Processing tools 1 having loadports 2 according to this norm have become very common in the case of 300 mm production and metrology tools. A free space in front of the processing tool 1 above the loadport surface extending at least up to the height of the vehicle according to this embodiment guarantees, that a device carrier 5 can be carried into this space by a lifting device 4 disposed on top of a vehicle chassis 3, which can be seen in FIG. 1C. In FIGS. 1A–1E, a vehicle serving the loadport 2 is displayed.

Figure 1B:
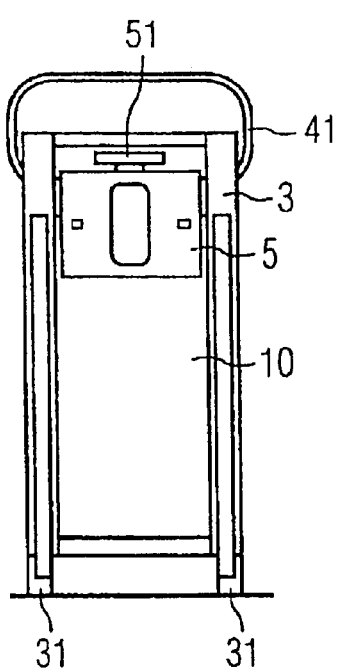
FIG. 1B is a diagrammatic, front elevational view of the preferred embodiment of the vehicle.
Figure 1C:
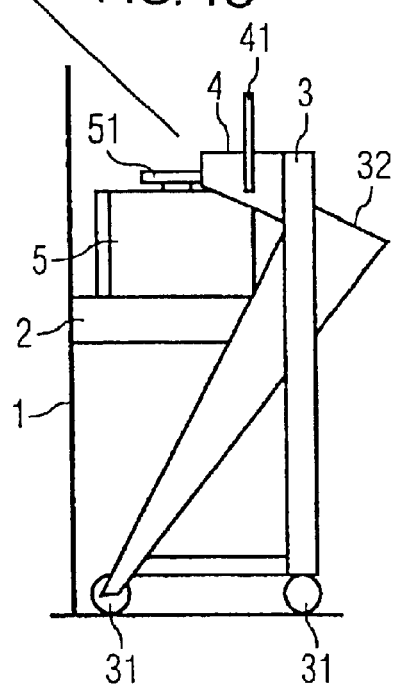
FIG. 1C is a diagrammatic, side-elevational view of the preferred embodiment of the vehicle.

As is evident from FIGS. 1A and 1C, the device carrier 5 is carried directly above the load port 2, and just needs to be released in a vertical movement onto kinematical pins 21, which are suited to corresponding groves in the bottom plate of the device carrier 5, in order to achieve high precision placement. In the top view of FIG. 1A it is easily recognized, that the vehicle footprint covers the loadport footprint, thus saving space, which had to be added in prior art.

FIG. 1B demonstrates, how an inner space 10 is embedded inside the chassis 3. The inner space 10 is delimited by the left and right side supports of the chassis 3, by the device carrier 5 held beneath the lifting device 4, and by the floor. Thereby a width of the inner space 10 is larger than a side length 23 of the loadport 2, and a depth of inner space 10 is larger than side depths 22 of the loadport 2. Thus, in a correct load position the load port 2 does not obstruct the chassis 3.

According to the embodiment the device carrier 5 is a front opening unified pod (FOUP), with the advantage, that the individual device handling is performed by the processing tool 1, and the lifting path length for the lifting device 4 just needs to be about 1 cm, which becomes evident from FIG. 1C. An interface for lifting 51 the device carrier 5 of the lifting device 4 has the form of a mushroom, with a fork lift as a lift connector device 42 as a suitable counterpart for lifting up or down the device carrier 5 but any other connecting device either hanging or sustaining can as well be utilized.

Having found the correct position to the loadport 2 or having docked the vehicle, an operator 9 can manually operate a crank 41 in order to lift up or down the device carrier 5. Since the device carrier 5 is lifted down to the loadport surface from the top and the lifting device 4 has it's support in the left and right side supports of the chassis 3 the lifting device 4 is essentially a portal hoist. According to this embodiment horizontal movements of the fork lift 42 on the portal hoist 4 are possible as well in order to improve placement characteristics.

Figure 1D:
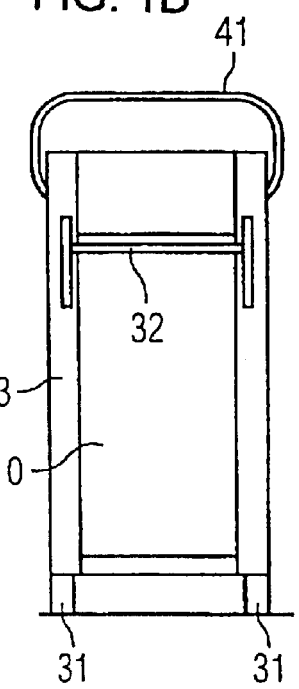
FIG. 1D is a diagrammatic, rear elevational view of the preferred embodiment of the vehicle.

Comparing FIGS. 1C and 1D the use of a main diagonal support 32 as a device 32 for pushing the vehicle can be seen. Operating the crank 41 and the device for pushing the vehicle 32 both from the back side of the vehicle, without the need to turn around the vehicle, simplifies the process of raising or releasing the device carrier 5 significantly. Moreover, the use of fixed axis wheels as front wheels 31 is possible, while the back wheels 31 being rotatable about the vertical axis are used to maneuver the vehicle. Thus, the time of the loading procedure can be minimized, and the complexity of the structure is still reduced.

Figure 1E:
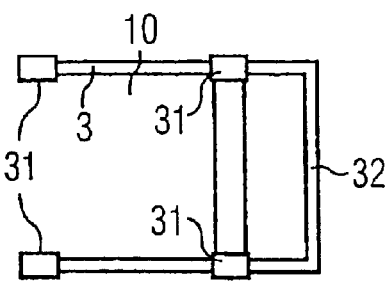
FIG. 1E is a diagrammatic, bottom plan view of the preferred embodiment of the vehicle.

A bottom view of the chassis 3 is shown in FIG. 1E. It can be seen, that chassis 3 simply has the form of a 'U'. Thus, even if there are protrusions beneath the load port 2, such as service wheels, they would be located inside inner space 10, if the vehicle is in load position, and would therefore not obstruct with the vehicle.

The amount of space saved in the clean room area according to the embodiment of the invention becomes evident from comparison of FIGS. 2A and 2B. Several processing tools 1 each having two loadports 2 enclosing an aisle 8 are shown.

In order to adhere to the regulations for emergency cases, there must be enough space for the operator 9 in the aisle 8 to pass through the vehicles standing opposite to each other, one of them serving one of the loadports 2, the other just standing in front of an opposite loadport 2'. In the prior art case a typical width of aisles 8 has been 2,200 mm, which may be observed in FIG. 2A, while according to the embodiment of the invention the width reduces to 1,600 mm, because the footprint of the vehicle can be laid over the footprint of a load port, which can be seen in FIG. 2B. Using a typical number of loadports 2 and processing tools 1 in a fab, 250 m² of space can be saved with a cost equivalent of about 5,000,000 Euro.

I claim:

1. A vehicle for transporting a semiconductor device carrier to a semiconductor processing tool, the semiconductor processing tool having a loadport for the semiconductor device carrier attached to the semiconductor processing tool, the loadport having a side length, a aide depth and a height, the semiconductor processing too providing a free apace above a top surface of the loadport, the loadport configured for receiving the semiconductor device carrier on the top surface of the loadport and the semiconductor device carrier having an interface for assisting in lifting the semiconductor device carrier, the vehicle comprising:

a U-shaped chassis as viewed from a bottom perspective, said U-shaped chassis containing a skeleton of support element surrounding and defining an inner space, said inner space being free of any of said support elements of said skeleton, and said U-shaped chasis having an open front side configured for receiving the loadport into said inner space, said inner space having a length larger than the side length of the loadport, and said inner space having a depth greater than the side depth of the loadport;

a set of wheels mounted to said U-shaped chassis for moving the vehicle;

a lifting device mounted to said U-shaped chassis within a vertical height range of a free apace designated for the loadport, said lifting device provided for placing or picking up the semiconductor device carrier onto the loadport when the loadport is received within said inner space;

vertically disposable lift connector devices mounted to the lifting device for connecting to the interface for assisting in lifting the device carrier; and a crank mechanism mounted on said U-shaped chassis for operating said lifting device.

2. The vehicle according to claim 1, further comprising a device for docking to the loadport, such that said lifting device carrying the semiconductor device carrier reaches a position directly above the loadport.

3. The vehicle according to claim 1, wherein said lift connector device is a fork lift, and the interface for assisting in lifting the device carrier has a mushroom shape.

4. The vehicle according to claim 1, wherein the semiconductor device carrier is a front opening unified pod carrying at least one semiconductor wafer of a diameter of at least 300 millimeters.

5. The vehicle according to claim 1, further comprising a device for pushing the vehicle manually by an operator.

6. The vehicle according to claim 1, wherein said lifting device is a portal hoist.

* * * * *

UNITED STATES PATENT AND TRADEMARK OFFICE
CERTIFICATE OF CORRECTION

PATENT NO. : 6,857,841 B2
DATED : February 22, 2005
INVENTOR(S) : Michael Lering It is certified that error appears in the above-identified patent and that said Letters Patent is hereby corrected as shown below:

Column 5,
Lines 30 and 31, should read as follows:
-- the loadport having a side length, a side depth and a height, the semiconductor processing tool providing a free space --

Column 6,
Line 3, should read as follows:
-- of said skeleton, and said U-shaped chassis having an --

Signed and Sealed this

Twenty-fourth Day of May, 2005

JON W. DUDAS
*Director of the United States Patent and Trademark Office*